United States Patent
Kühn et al.

(10) Patent No.: US 7,552,601 B2
(45) Date of Patent: Jun. 30, 2009

(54) OPTICAL COMPONENT OF QUARTZ GLASS, METHOD FOR PRODUCING THE OPTICAL COMPONENT, AND USE THEREOF

(75) Inventors: Bodo Kühn, Hanau (DE); Stephan Thomas, Großkrotzenburg (DE); Steffen Kaiser, Hanau (DE)

(73) Assignee: Heraeus Quarzglas GmbH & Co. KG, Hanau (DE)

( * ) Notice: Subject to any disclaimer, the term of this patent is extended or adjusted under 35 U.S.C. 154(b) by 221 days.

(21) Appl. No.: 11/093,318

(22) Filed: Mar. 30, 2005

(65) Prior Publication Data

US 2005/0217318 A1  Oct. 6, 2005

(30) Foreign Application Priority Data

Apr. 2, 2004  (DE) .................. 10 2004 017 031

(51) Int. Cl.
*C03B 31/018* (2006.01)
*C03B 15/00* (2006.01)
*C03B 37/00* (2006.01)

(52) U.S. Cl. .................. 65/422; 65/30.1; 65/32.1

(58) Field of Classification Search .............. 65/32.1, 65/422
See application file for complete search history.

(56) References Cited

U.S. PATENT DOCUMENTS

| 6,508,084 B1* | 1/2003 | Yokota et al. | 65/424 |
| 6,761,951 B2* | 7/2004 | Otsuka et al. | 428/64.1 |
| 7,312,170 B2* | 12/2007 | Nishimura et al. | 501/54 |
| 2003/0074925 A1* | 4/2003 | Brennan et al. | 65/392 |
| 2003/0138587 A1* | 7/2003 | Otsuka et al. | 428/64.1 |
| 2005/0109435 A1* | 5/2005 | Liebermann et al. | 148/561 |
| 2006/0183622 A1* | 8/2006 | Nishimura et al. | 501/54 |

FOREIGN PATENT DOCUMENTS

| DE | 101 59 961 C2 | 6/2003 |
| EP | 0 401 845 A2 | 12/1990 |
| EP | 1 125 897 A1 | 8/2001 |

OTHER PUBLICATIONS

N.F. Borrelli, C.M. Smith, J.J. Price, and D.C. Allan, "Polarized Excimer Laser-Induced Birefringence in Silica". Applied Physics Letters, vol. 80, No. 2, (2002), p. 219-221.

(Continued)

*Primary Examiner*—Steven P Griffin
*Assistant Examiner*—Russell J Kemmerle, III
(74) *Attorney, Agent, or Firm*—Tiajoloff and Kelly, LLP

(57) ABSTRACT

Starting from an optical component of quartz glass for transmitting ultraviolet radiation of a wavelength between 190 nm and 250 nm, with a glass structure essentially without oxygen defects, a hydrogen content ranging from $0.1 \times 10^{16}$ molecules/cm$^3$ to $5.0 \times 10^{16}$ molecules/cm$^3$, and with a content of SiH groups of less than $5 \times 10^{16}$ molecules/cm$^3$, to provide such a component which is particularly well suited for use with linearly polarized UV laser radiation, the present invention suggests that the component should have a content of hydroxyl groups ranging from 10 to 250 wt ppm and a fictive temperature above 1000° C.

15 Claims, 4 Drawing Sheets

OTHER PUBLICATIONS

Figure 1:
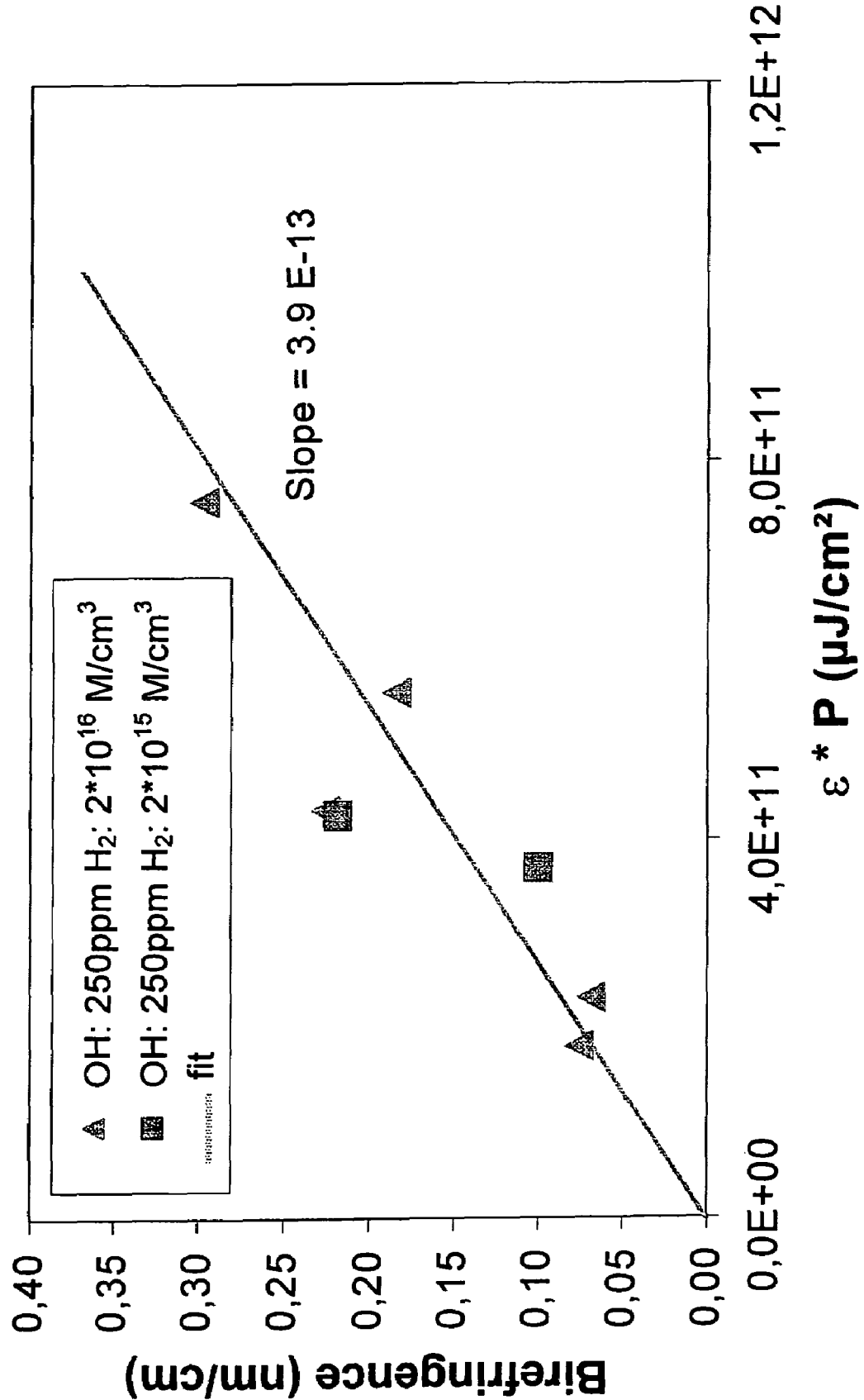

Khotimchenko et al, "Determining the Content of Hydrogen Dissolved in Quartz Glass . . . ". Zhurnal Prikladnoi Spektroskopii, vol. 46, No. 6 (Jun. 1987), p. 987-991.

Shelby, "Reaction of Hydrogen with Hydroxyl-Free Vitreous Silica". J. Appl. Phys., vol. 51, No. 5 (May 1980), p. 2589-2593.

D.M. Dodd et al., "Optical Determinations of OH in Fused Silica", Communications, (1966), p. 3911.

CH. Pfleiderer et al., "The UV-Induced 210 nm Absorption Band in Fused Silica with Different Thermal History and Stoichiometry". J. Non-Cryst. Solids 159 (1993), p. 145-153.

R. Brückner, "Silicon Dioxide". Encyclopedia of Applied Physics, vol. 18 (1997), p. 101-131.

* cited by examiner

OPTICAL COMPONENT OF QUARTZ GLASS, METHOD FOR PRODUCING THE OPTICAL COMPONENT, AND USE THEREOF

The present invention was developed under terms of a joint research agreement between Heraeus Quarzglas GmbH & Co. KG, Shin-Etsu Quartz Products, Ltd and Heraeus Tenevo AG, which has now merged with Heraeus Quarzglas GmbH & Co. KG.

The present invention relates to an optical component of quartz glass for transmitting ultraviolet radiation of a wavelength between 190 nm and 250 nm with a glass structure essentially without oxygen defects, a hydrogen content ranging from $0.1 \times 10^{16}$ molecules/cm$^3$ to $5.0 \times 10^{16}$ molecules/cm$^3$ and a content of SiH groups of $<5 \times 10^{16}$ molecules/cm$^3$.

Furthermore, the present invention relates to a method for producing such an optical component of quartz glass, and to the use thereof.

Methods for producing synthetic quartz glass by oxidation or by flame hydrolysis of silicon-containing start substances are generally known under the names VAD (vapor-phase axial deposition), OVD (outside vapor phase deposition), MCVD (modified chemical vapor deposition) and PCVD (or also PECVD; plasma enhanced chemical vapor deposition) methods. In all of these procedures SiO$_2$ particles are normally produced by means of a burner and deposited in layers on a carrier which is moved relative to a reaction zone. At a sufficiently high temperature in the area of the carrier surface, "direct vitrification" of the SiO$_2$ particles takes place. By contrast, in the so-called "soot method" the temperature is so low during deposition of the SiO$_2$ particles that a porous soot layer is obtained which is sintered in a separate step of the method to obtain transparent quartz glass. Both direct vitrification and soot method produce a dense transparent synthetic quartz glass of high purity in the form of rods, blocks, tubes or plates, which are further processed into optical components such as lenses, windows, filters, mask plates for use, for instance, in microlithography.

EP-A 401 845 describes methods for producing plate-shaped quartz glass blanks by direct vitrification and according to the soot method. To reduce mechanical stresses inside the blanks and to achieve a homogeneous distribution of the fictive temperature, the blanks are normally annealed with great care. An annealing program is suggested in which the blank is subjected to a holding time of 50 hours at a temperature of about 1100° C. and is subsequently cooled in a slow cooling step at a cooling rate of 2°/h to 900° and then cooled in the closed furnace to room temperature.

A similar method for producing a component of synthetic quartz glass for use in microlithography according to the soot method is also known form EP 1 125 897 A1.

A quartz glass blank for an optical component of the above-mentioned type is described in DE 101 59 961 C2. Such optical components of quartz glass are used for transmitting high-energy ultraviolet laser radiation, for instance in the form of optical exposure systems in microlithography devices for producing large-scale integrated circuits in semiconductor chips. The exposure systems of modern microlithography devices are equipped with excimer lasers emitting high-energy pulsed UV radiation of a wavelength of 248 nm (KrF laser) or 193 nm (ArF laser).

In microlithographic projection exposure systems the demand is in general made that a light distribution provided in the area of a pupil plane of the exposure system should be transmitted as homogeneously as possible and in an angle-maintaining manner into a pupil plane of the projection lens conjugated relative to the pupil plane of the exposure system. Each change in the angular spectrum that is created in the optical path leads to a distortion of the intensity distribution in the lens pupil, which leads to an asymmetrical irradiation and thus to a deterioration of the imaging performance. Linearly polarizing light sources, such as excimer lasers, normally have a degree of polarization of about 90% to 95%. With the help of a λ/4 plate the light is circularly polarized and should ideally be maintained in this circular state up to the wafer to be exposed.

In this context birefringence plays an important role because it impairs the imaging fidelity of optical components of quartz glass. Stress birefringence in the quartz glass is, for instance, created during inhomogeneous cooling of the blank used for the optical component to be produced, or by the UV irradiation itself.

Recently, experiments were carried out with projection systems which operate with a technique called "immersion lithography". The gap between the image plane and the last optical component of the lens system is here filled with a liquid (usually deionized water) with a higher refractive index than air, ideally with the refractive index of the quartz glass at the wavelength used. The higher refractive index of the liquid in comparison with air entails a greater numerical aperture of the optical component, thereby improving the imaging characteristics. "Immersion lithography" is however polarization sensitive; the best results will be obtained when linearly polarized laser radiation is used and not, as is otherwise standard practice, completely or partly circularly polarized laser radiation. It is described in "N. F. Borelli, C. M. Smith, J. J. Price, D. C. Allan "Polarized excimer laser-induced birefringence in silica", Applied Physics Letters, Vol. 80, No. 2, (2002), p. 219-221" that the use of linearly polarized UV laser radiation seriously damages the glass structure of the optical quartz glass component, which will be explained in more detail in the following.

The so-called "compaction" of the quartz glass after irradiation with short-wave UV radiation is expressed in a local density increase of the glass in the irradiated volume. This leads to a locally inhomogeneous rise of the refractive index and thus to a deterioration of the imaging characteristics of the optical component. It has now been found that circularly polarized UV radiation effects a rather isotropic density change, and linearly polarized UV radiation a rather anisotropic density change. The difference will be explained with reference to FIG. 4.

The diagram of FIG. 4a) schematically shows a volume element 40 (symbolized by its position and extension along the x-axis) which is irradiated with UV radiation of an energy density of 0.08 (in relative units) (circular irradiation spot).

FIG. 4b) shows the result of irradiation upon use of circularly polarized UV radiation. After irradiation the density of the irradiated volume element is, on the whole, higher than the density of the surrounding quartz glass (isotropic density change). In the area of the transition between compacted and non-compacted material, stresses are therefore created that are optically expressed as stress birefringence. In the two-dimensional illustration of FIG. 4b, these stresses are illustrated around the edge of the circular irradiation spot as maxima 41, 42 of the stress birefringence. In a top view on the volume element 40, the maxima 41, 42 belong to a ring extending around the volume 40. Once produced, this isotropic density and refractive index change (stress birefringence) effects a change in the imaging characteristics of the lens. Due to its circular symmetry said change, however, has substantially the same effect during later use of the component; it can thus be calculated.

By contrast, an irradiation of the volume element 40 with a linearly polarized UV laser radiation effects an anisotropic density change, as outlined in FIG. 4c). A maximum of the density change, and thus also a maximum 43 of the birefringence generated thereby, is here produced that shows a preferred direction in the direction of the polarization vector of the incident UV radiation. The anisotropic density and refractive index change produced thereby is not substantially radially symmetrical and also effects a change in the imaging characteristics of the component. This change is disadvantageous—especially upon a change in the polarization direction of the transmitted UV radiation, which must be expected in the course of the lifetime of the component, because its influence on imaging can hardly be calculated. Therefore, such a pre-damaged quartz glass component is hardly suited for other applications, which limits the service life of the optical component.

It is the object of the present invention to provide an optical component which is particularly suited for use with linearly polarized UV laser radiation, and which even after use with linearly polarized radiation can still be used in a variable manner. Moreover, it is the object of the present invention to indicate a method for producing such an optical component, and a special use therefor.

As for the optical component, this object is achieved according to the invention by an embodiment of the component which combines the following properties:

a glass structure essentially without oxygen defects, an $H_2$ content ranging from $0.1 \times 10^{16}$ molecules/cm$^3$ to $5.0 \times 10^{16}$ molecules/cm$^3$, a content of SiH groups of less than $5 \times 10^{16}$ molecules/cm$^3$, a content of hydroxyl groups ranging from 10 to 250 wt ppm, and a fictive temperature above 1000° C.

Ideally, the properties (fictive temperature) are constant over the used volume of the optical component and the indicated components are evenly distributed. The concentration and temperatures indicated above are mean values within the optically used range of the component (also designated as "CA (clear aperture) area" or "optically used volume").

A glass structure that is substantially free from oxygen defects is here understood to mean a glass structure in which the concentrations of oxygen deficiency defects and excess oxygen defects are below the detection limit of the method of Shelby. Said detection method is published in "Reaction of hydrogen with hydroxyl-free vitreous silica" (J. Appl. Phys. Vol. 51, No. 5 (May 1980), pp. 2589-2593). Quantitatively, this yields a number of oxygen deficiency defects or excess oxygen defects in the glass structure of not more than $10^{17}$ per gram quartz glass.

The hydrogen content ($H_2$ content) is determined by a Raman measurement, which was first suggested by Khotimchenko et al. ("Determining the Content of Hydrogen Dissolved in Quartz Glass Using the Methods of Raman Scattering and Mass Spectrometry" Zhurnal Prikladnoi Spektroskopii, Vol. 46, No. 6 (June 1987), pp. 987-991).

The content of SiH groups is determined by means of Raman spectroscopy, a calibration being carried out on the basis of a chemical reaction: Si—O—Si+$H_2$→Si—H+ Si—OH, as described in Shelby "Reaction of hydrogen with hydroxyl-free vitreous silica" (J. Appl. Phys., Vol. 51, No. 5 (May 1980), pp. 2589-2593).

The hydroxyl group content (OH content) follows from a measurement of the IR absorption according to the method of D. M. Dodd et al. ("Optical Determinations of OH in Fused Silica", p. 3911).

The fictive temperature is a parameter which characterizes the specific network structure of the quartz glass. A standard measuring method for determining the fictive temperature by way of a measurement of the Raman scattering intensity at a wavelength of about 606 cm$^{-1}$ is described in "Ch. Pfleiderer et al.: "The UV-induced 210 nm absorption band in fused silica with different thermal history and stoichiometry"; J. Non-Cryst. Solids 159 (1993) 145-143".

In comparison with the quartz glass described in DE 101 59 961 C2, the quartz glass of the optical component of the invention is characterized by a comparatively low OH content noz exceeding 250 wtppm, and particularly by a high fictive temperature.

Surprisingly, it has been found that an optical component made from a quartz glass having the above-indicated properties will only experience a small anisotropic density change upon use with linearly polarized UV laser radiation.

This is said to be due to the comparatively low hydroxyl group content of the quartz glass and its relatively high fictive temperature. With a decreasing hydroxyl group content of a quartz glass the viscosity thereof is increasing. On the other hand, it is known that quartz glass (with a high fictive temperature) which is rapidly cooled from the temperature range between 1000° C. and 1500° C. has a lower specific volume and thus a higher specific density than quartz glass (with a low fictive temperature) which is cooled at a slow rate. According to "R. Brückner, Silicon Dioxide; Encyclopedia of Applied Physics, Vol. 18 (1997), pp. 101-131", this effect is due to an anomaly of synthetic quartz glass in the case of which the evolution of the specific volume in the range between 1000° and 1500° C. has a negative temperature coefficient, i.e., the specific volume of quartz glass increases in this temperature range with a decreasing temperature, or in other words, the quartz glass rapidly cooled from the said temperature range and having a high fictive temperature has a higher density than quartz glass which is cooled at a slow rate and has a low fictive temperature. The density of the quartz glass which is also higher due to the higher fictive temperature acts like an "anticipated" compaction of the glass structure on the whole. In this respect the compact network structure counteracts the effect of a local compaction upon UV radiation. It has been found that the portion of a compaction that is due to an isotropic density change can thus be reduced, and it must be expected that this will also reduce the risk of an anisotropic density change with respect to linearly polarized UV radiation.

Apart from the enhanced viscosity, the low OH content may also show another important aspect with respect to the prevention of an anisotropic density change. It is assumed that the change in density is accompanied by a rearrangement of hydroxyl groups, this rearrangement mechanism being all the more likely and easier the more hydroxyl groups are available. The low hydroxyl group content and the increased density (high fictive temperature) of the quartz glass therefore reduce the sensitivity of the glass structure over a local anisotropic density change. The quartz glass component of the invention thus withstands the compaction effect of UV radiation in a better way than the known quartz glass qualities, so that it is particularly well suited for use in the transmission of linearly polarized UV radiation having a wavelength of between 190 nm and 250 nm.

It has turned out to be particularly advantageous when the quartz glass has a fictive temperature above 1050° C., preferably above 1100° C.

The higher the fictive temperature of the quartz glass, the higher is its density and the more pronounced the above-described effect of the "anticipated" compaction of the quartz glass on the whole, and thus the resistance to a local anisotropic density increase by linearly polarized UV radiation. At very high fictive temperatures (>1200° C.) this positive effect, however, may be impaired by excessively high and thermally created stress birefringence.

As for a high viscosity of the quartz glass, preference is given to an embodiment of the optical component in which the quartz glass has a content of hydroxyl groups between 30 and 200 wt ppm, preferably below 125 wt ppm.

The low hydroxyl group content effects an increase in viscosity. The accompanying improvement of the behavior over a local anisotropic density change is surprising insofar as it is assumed in the above-mentioned DE 101 59 961 C2 that a quartz glass having a hydroxyl group content of less than 125 wt ppm, as is typical of the quartz glass produced according to the soot method, tends to compaction.

The viscosity increasing effect of the comparatively low hydroxyl group content can be compensated by a high fluorine content completely or in part. Therefore, the quartz glass for the optical component of the invention has preferably a content of fluorine of less than 100 wt ppm. Moreover, fluorine reduces the refractive index of quartz glass so that the variability during use is reduced in the case of a quartz glass doped with fluorine ($\geqq$100 wt ppm).

As for the method, the above-indicated object is achieved according to the invention by a method comprising the following steps:

producing an $SiO_2$ soot body, vitrifying the soot body under vacuum with formation of a cylindrical quartz glass blank with a hydroxyl group content ranging between 10 and 250 wt ppm, preferably between 30 and 200 wt ppm, and particularly preferably below 125 wt ppm, annealing the quartz glass blank with formation of a quartz glass cylinder, with a fictive temperature above 1000° C., preferably above 1050° C., and particularly preferably above 1100° C., which surrounds a contour of the optical component to be produced with an overdimension, removing part of the axial overdimension in the area of the faces of the quartz glass cylinder, loading the quartz glass cylinder with hydrogen by heating in a hydrogen-containing atmosphere at a temperature below 500° C. with generation of a mean hydrogen content in the range of $0.1 \times 10^{16}$ molecules/cm$^3$ to $5.0 \times 10^{16}$ molecules/cm$^3$.

"Direct vitrification" normally yields quartz glass having an OH content of 450 to 1200 wt ppm, whereas rather low OH contents ranging between a few wt ppm and 300 wt ppm are typical of quartz glass produced according to the "soot method". The quartz glass for the optical component according to the invention is therefore preferably produced by means of the "soot method". In this method an $SiO_2$ soot body is produced as an intermediate product having a hydroxyl group content that can be adjusted in a simple way to a predetermined value through the duration and intensity of a dehydration treatment.

The soot body is vitrified under vacuum with formation of a cylindrical quartz glass blank. Molecular hydrogen is removed by way of the vacuum. This hydrogen is introduced into the quartz glass during the flame hydrolysis method due to the production process and would otherwise further react in subsequent heat treatment steps to form undesired SiH groups which in the course of the further treatment steps would be noticed in a disadvantageous way and would lead to a deterioration of the damage behavior of the quartz glass component. The vacuum serves to accelerate the degasification operation.

After vitrification a quartz glass blank is present with a hydroxyl group content in the range between 10 and 250 wt ppm, preferably between 30 and 200 wt ppm, and particularly preferably below 125 wt ppm, and is substantially free of SiH groups and hydrogen (the content of both components is below the detection limit).

The quartz glass blank is subsequently annealed, attention being paid to the adjustment of a fictive temperature above 1000° C., preferably above 1050° C., and particularly preferably above 1100° C. The predetermined fictive temperature can be maintained by the measures that the quartz glass blank is held at a temperature within the range of the desired fictive temperature until the setting of the structural balance and is then cooled rapidly, or that the blank is cooled at a sufficiently fast rate from a temperature above the fictive temperature to be set. Attention must here be paid on the one hand that the desired high fictive temperature is maintained and that no stress birefringence is produced on the other hand. The one precondition (high fictive temperature) is taken into account through the lower limit of a cooling rate, and the other precondition (low stress birefringence) through a corresponding lower limit which will be explained in more detail further below.

Due to the setting of a comparatively high fictive temperature the quartz glass cylinder obtained exhibits residual stresses which are above all noticed in the more rapidly cooling peripheral portion of the component. Therefore, a portion which pertains to the overdimension surrounding the contour of the optical component to be produced is removed from both faces of the cylinder. Due to the previous removal of this overdimension (or a part thereof), the loading duration during subsequent loading of the quartz glass cylinder with hydrogen is shortened, the loading duration being required for setting a mean hydrogen content ranging from $0.1 \times 10^{16}$ molecules/cm$^3$ to $5.0 \times 10^{16}$ molecules/cm$^3$.

It is known that hydrogen has a healing effect with respect to defects created by UV irradiation in the quartz glass. In the method of the invention, the hydrogen content is however reduced to a considerable extent, e.g. due to the above-explained vacuum treatment of the soot body. Therefore, the quartz glass is subsequently loaded with hydrogen. Hydrogen loading takes place at a low temperature below 500° C. to reduce the formation of SiH groups. SiH groups in the quartz glass are undesired because a so-called E' center and atomic hydrogen are formed therefrom upon irradiation with high-energy UV light. The E' center effects an increased absorption at a wavelength of 210 nm and is unfavorably noticed in the adjoining UV wavelength range as well. Due to thermodynamic conditions SiH groups are increasingly formed at elevated temperatures (500° C.-800° C.) in the presence of hydrogen, and the comparatively low OH content of the quartz glass also shifts the balance towards SiH formation.

The annealing of the quartz glass blank primarily serves to reduce stresses, to adjust the desired fictive temperature, and thus a compaction-resistant glass structure, and it preferably comprises the following method steps:

holding the quartz glass blank for a first holding period of at least 4 hours at a first higher annealing temperature which is at least 50° C. above the fictive temperature of the quartz glass component to be set, cooling at a first lower cooling rate to a second lower annealing temperature which is in the range between +/−20° C. around the fictive temperature of the quartz glass component to be set, holding at the lower annealing temperature for a second holding period, and cooling to a predetermined final temperature below 800° C., preferably below 400° C., at a second higher cooling rate which is at least 25° C./h.

It has been found that a high fictive temperature is accompanied by the generation of a comparatively dense network structure which counteracts a further local compaction by UV irradiation and particularly an anisotropic density change by linearly polarized UV radiation. The above-indicated preferred annealing program includes heating to a temperature clearly above the fictive temperature (>50° C.), cooling to a temperature in the range around the fictive temperature to be set, and then comparatively rapid cooling of the quartz glass blank to a low temperature below which no essential changes in the glass structure are to be expected any more.

This is a comparatively short annealing method, which although it might entail drawbacks with respect to stress birefringence effects an enhanced stability with respect to local compaction by UV radiation and, apart from saving time, has the further advantage that due to the comparatively short treatment duration at a high temperature the formation of inhomogeneities due to out-diffusion of components and contaminations by diffusing impurities are avoided.

A particularly compact network structure is obtained when the first cooling rate is set in the range between 1° C./h and 10° C./h, and preferably to a value in the range between 3° and 5° C./h.

As for a compact glass structure, it has also turned out to be advantageous when the second cooling rate is set in the range between 25° and 80° C./h, preferably above 40° C./h.

The faster the cooling process, the greater are the above-mentioned advantages with respect to saving time, reduction of diffusion effects and action of the "previously compacted" glass structure.

In a preferred embodiment of the method of the invention, the second holding time is between 1 hour and 16 hours.

The quartz glass is once again given the opportunity to relax. The temperature distribution inside the quartz glass blank is homogenized and thermal gradients that lead to stress birefringence are reduced.

In this connection and also with respect to an adjustment of a glass structure that is as fast as possible and near the predetermined fictive temperature, the first holding time is not more than 50 hours.

Advantageously, the quartz glass blank is loaded with hydrogen at a pressure between 1 and 150 bar.

An increased pressure accelerates hydrogen loading and may also have an effect on the density in the sense of a more compact network structure that is more resistant to a local anisotropic density change.

For achieving a small formation of SiH groups a procedure is preferred in which the quartz glass blank is loaded with hydrogen at a temperature below 400° C., preferably below 350° C.

The optical quartz glass component of the invention or the optical component produced according to the method of the invention is characterized by low sensitivity to a local anisotropic density change upon irradiation with short-wave UV radiation. Therefore, it is preferably used as an optical component in a projection system of an automatic exposure machine for immersion lithography for the purpose of transmitting ultraviolet, pulsed and linearly polarized UV laser radiation of a wavelength between 190 nm and 250 nm.

The quartz glass component has turned out to be particularly stable with respect to UV laser radiation of this wavelength if it has an energy density of less than 300 $\mu J/cm^2$, preferably less than 100 $\mu J/cm^2$, and a pulse width in time of 50 ns or more, preferably 150 ns or more.

Figure 2:
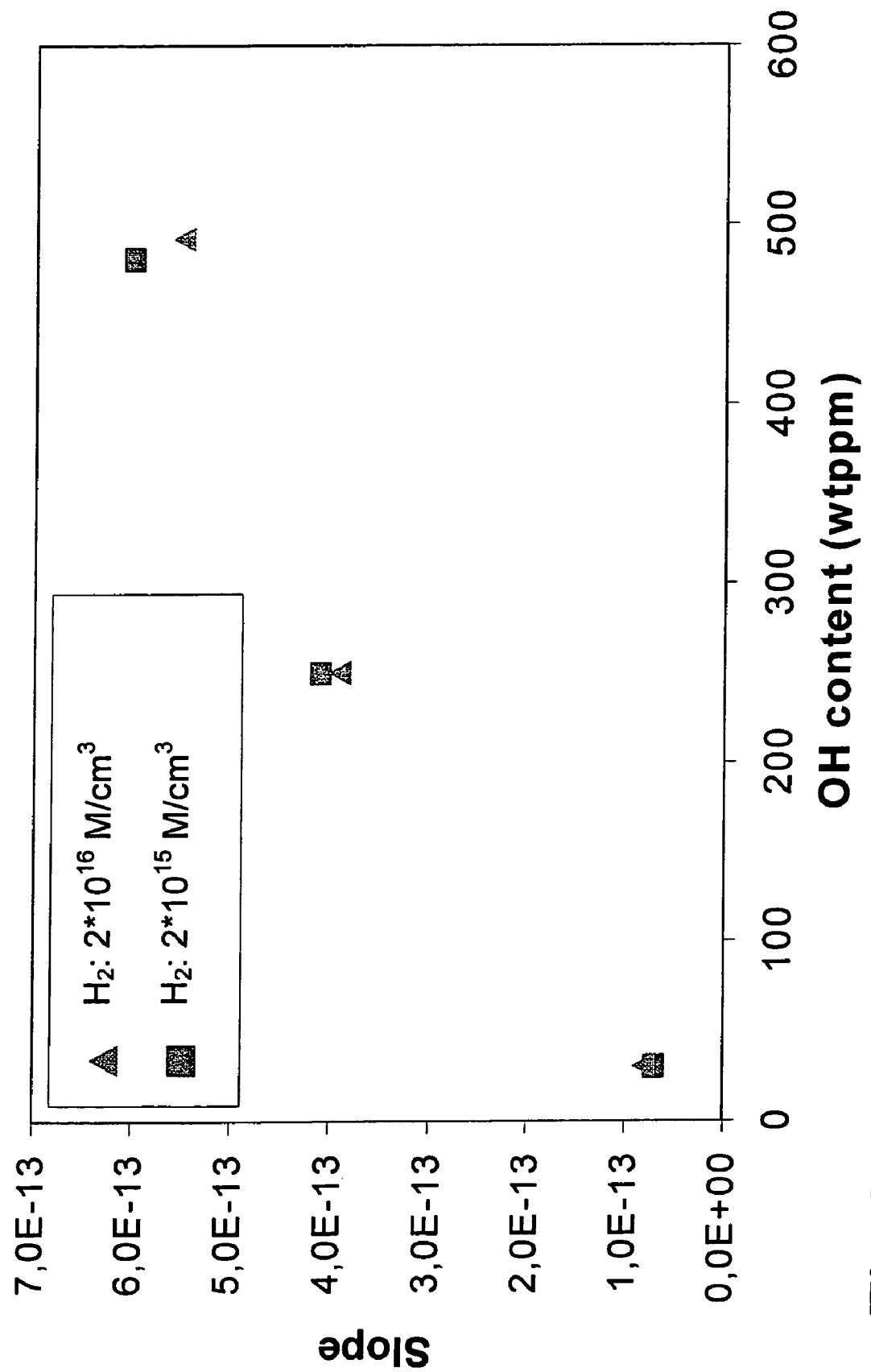
Figure 3:
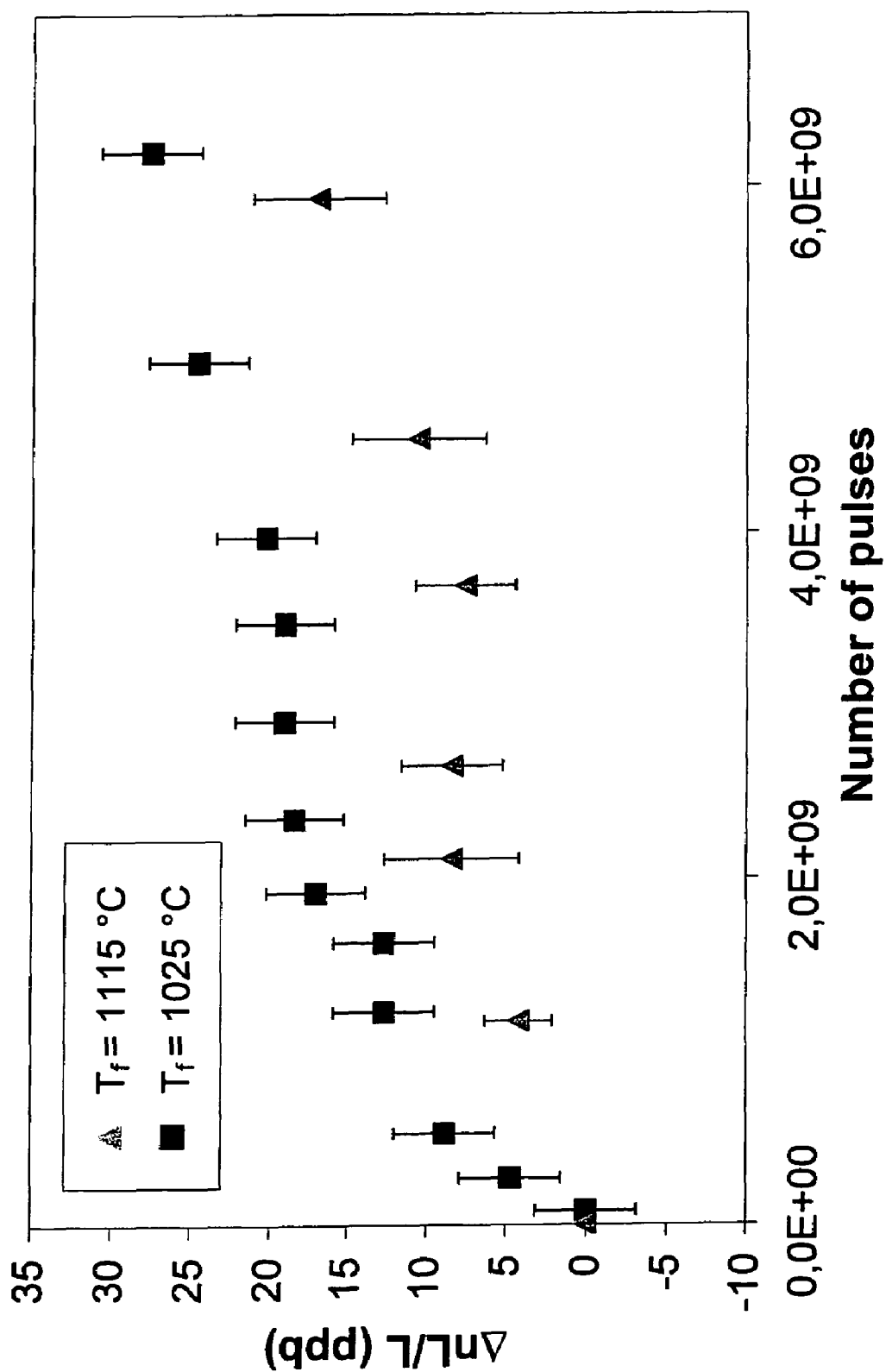
Figure 4:
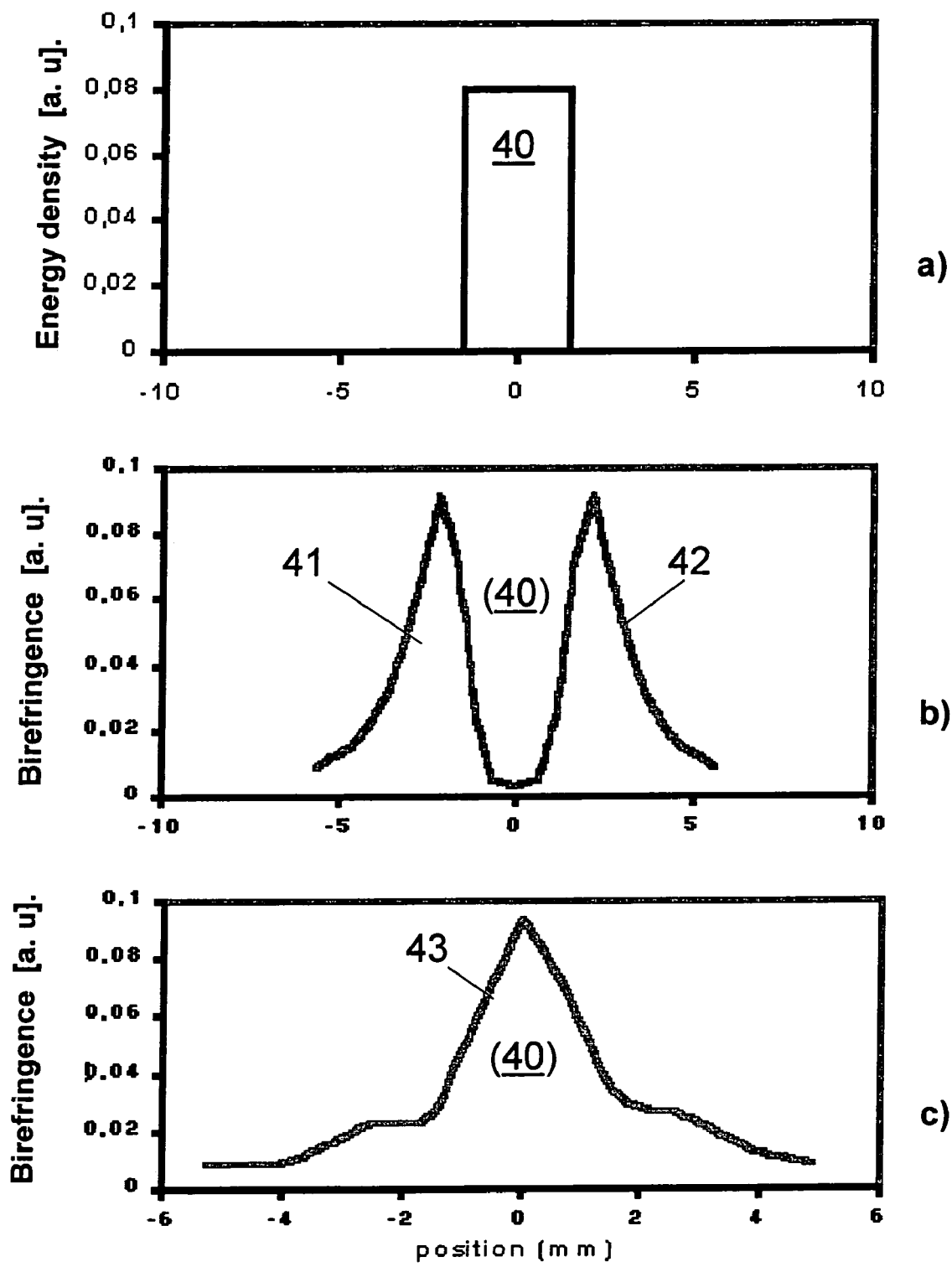

The invention shall now be explained in more detail with reference to embodiments and a drawing, in which FIG. 1 shows a diagram regarding the dependence of the UV radiation-induced birefringence on the energy dose (energy density×pulse number) of the radiation;

FIG. 2 a diagram regarding the dependence of the UV radiation-induced birefringence (slope of the straight line of FIG. 1) on the hydroxyl group content of the quartz glass;

FIG. 3 a diagram regarding the dependence of the UV radiation-induced birefringence on the pulse number of the radiation in two quartz glass qualities that differ in their fictive temperature;

FIG. 4 a graph for explaining the isotropic and the anisotropic density change upon UV radiation.

SAMPLE PREPARATION

A soot body is produced by flame hydrolysis of $SiCl_4$ with the help of the known VAD method. The soot body is dehydrated at a temperature of 1200° C. in a chlorine-containing atmosphere and then vitrified at a temperature of about 1750° C. in vacuum ($10^{-2}$ mbar) to form a transparent quartz glass blank. This blank is then homogenized by thermally mechanical homogenization (twisting) and formation of a quartz glass cylinder. The quartz glass cylinder has then an OH content of about 250 wt ppm.

Sample 1

For reducing stresses and birefringence and for producing a compaction-resistant glass structure, the quartz glass cylinder is subjected to an annealing treatment which is particularly characterized by its shortness. The quartz glass cylinder is here heated to 1130° C. in air and at atmospheric pressure for a holding time of 8 hours and then cooled at a cooling rate of 4° C./h to a temperature of 1030° C. and held at this temperature for 4 hours. Thereupon, the quartz glass cylinder is cooled at a higher cooling rate of 50°/h to a temperature of 300° C., whereupon the furnace is switched off and the quartz glass cylinder is left to the free cooling of the furnace.

The quartz glass cylinder treated in this way has an outer diameter of 350 mm and a thickness of 60 mm. The quartz glass has a mean fictive temperature of 1035° C. It has been found that the cylinder exhibits relatively strong stress birefringence probably due to the rapid cooling from the temperature of 1030° C., particularly in its peripheral portions. Part of the overdimension with respect to the component contour, namely a thickness of 3 mm, is removed from the faces of the quartz glass cylinder before the next treatment step.

Thereupon, the quartz glass cylinder is held in a pure hydrogen atmosphere at 380° C. first at a pressure of 10 bar for a duration of 22 hours and then at a pressure of 0.07 bar for a duration of 816 hours.

The quartz glass cylinder obtained thereafter is substantially free of oxygen defects and SiH groups (below the detection limit of $5\times10^{16}$ molecules/$cm^3$), and it is characterized within a diameter of 280 mm (CA area) by a mean hydrogen content of $2\times10^{16}$ molecules/$cm^3$ (outside thereof about $3.6\times10^{15}$ molecules/$cm^3$), a hydroxyl group content of 250 wt ppm and a mean fictive temperature of 1035° C. The quartz glass is not additionally doped with fluorine; the fluorine content is below 1 wt ppm.

Sample 2

Another quartz glass cylinder was produced, as described with reference to sample 1, but hydrogen loading of the quartz glass cylinder took place in a pure hydrogen atmosphere in a first process step at 340° C. and at a pressure of 10 bar for a duration of 8 hours, and in a second process step at 340° C. at a pressure of 0.007 bar and for a duration of 1570 hours.

The quartz glass cylinder obtained thereafter is essentially free from oxygen defects and SiH groups (below the detection limit of $5 \times 10^{16}$ molecules/cm$^3$), and it is characterized within a diameter of 280 mm (CA area) by a mean hydrogen content of about $2 \times 10^{15}$ molecules/cm$^3$ (outside thereof about $3 \times 10^{15}$ molcules/cm$^3$), a hydroxyl group content of 250 wt ppm and a mean fictive temperature of 1035° C. The quartz glass is not additionally doped with fluorine; the fluorine content is below 1 wt ppm.

Sample 3

Another quartz glass cylinder was produced, as described above with reference to sample 1, including hydrogen loading, but the annealing treatment took place with the following heating program: The quartz glass cylinder is heated in air and at atmospheric pressure to 1250° C. for a holding time of 8 hours and is subsequently cooled at a cooling rate of 4° C./h to a temperature of 1130° C., and held at this temperature for 4 hours. Thereupon, the quartz glass cylinder is cooled at a higher cooling rate of 70° C./h to a temperature of 300° C., whereupon the furnace is switched off and the quartz glass cylinder is left to the free cooling of the furnace.

Following hydrogen loading of the quartz glass cylinder, said cylinder is substantially free from oxygen defects and SiH groups (below the detection limit of $5 \times 10^{16}$ molecules/cm$^3$), and it is characterized by a hydrogen content of $2 \times 10^{16}$ molecules/cm$^3$) and a hydroxyl group content of 250 wt ppm and a mean fictive temperature of 1115° C.

Sample 4

A soot body is produced by flame hydrolysis of $SiCl_4$ with the help of the known VAD method as explained above. The soot body is dehydrated at a temperature of 1200° C. in a chlorine-containing atmosphere and then vitrified at a temperature of about 1750° C. in vacuum ($10^{-2}$ mbar) to form a transparent quartz glass blank. Due to a more excessive dehydration treatment (compared to the samples 1 to 3), the OH content is about 120 wt ppm. This blank is then homogenized by thermally mechanical homogenization (twisting) and formation of a quartz glass cylinder as explained above.

Measurement Results

Measurement samples are made from the quartz glass cylinders produced in this way for determining the resistance of the quartz glass to irradiation with linearly polarized UV excimer laser radiation of a wavelength of 193 nm.

A result of this measurement is shown in FIG. 1. For samples 1 and 2 birefringence is here plotted in nm/cm on the Y-axis, and a parameter characterizing the energy of the transmitted UV radiation, namely the product following from the energy density of the UV radiation in μJ/cm$^2$ and the pulse number, is plotted on the X-axis.

Hence, both in the sample having a low hydrogen content ($2 \times 10^{15}$ molecules/cm$^3$) and in the sample having a higher hydrogen content ($3 \times 10^{16}$ molecules/cm$^3$), birefringence increases approximately linearly with an increasing product $\epsilon \times P$. The slope of the straight line is here about $3.9 \times 10^{-13}$, and it is a measure of the sensitivity of the quartz glass to linearly polarized UV radiation with respect to anisotropic changes in its density.

Corresponding tests were carried out for further quartz glass samples which have a hydroxyl group content of 30 wt ppm and of about 480 wt ppm, respectively, and otherwise correspond to samples 1 and 2. The test results are summarized in the diagram of FIG. 2. The slope of the straight line is respectively plotted on the X-axis, as shown for samples 1 and 2 with reference to FIG. 1. The X-axis shows the respective OH content of the samples in wt ppm.

As can clearly be seen, the slope is strongly scaled with the OH content substantially independently of the hydrogen content of the sample. This means that with an increasing OH content the sensitivity of the quartz glass samples greatly increases with respect to an anisotropic density change upon irradiation with linearly polarized laser light radiation of a wavelength of 193 nm. The corresponding resistance of the quartz glass samples 1 and 2 (with an OH content of 250 wt ppm) can just be regarded as acceptable. At increased OH contents the sensitivity of the quartz glass with respect to an anisotropic density change is however no longer acceptable. The best resistance was found in the measurement samples of quartz glass having an OH content of 30 wt ppm.

The diagram of FIG. 3 shows the wavefront distortion indicated as a change in the refractive index based on the distance $\Delta$nL/L in ppb, depending on the pulse number upon irradiation of two different quartz glass samples (sample 1 and sample 3) which differ in their fictive temperature. These samples were exposed to linearly polarized UV radiation of a wavelength of 193 nm, at a pulse width of 25 ns and an energy density of 35 μJ/cm$^2$ and the wavefront distortion produced thereby was measured from time to time.

As can be seen therefrom, the wavefront distortion passes at an increasing pulse number after an initially steep rise into a distinctly flatter rise, the level of the wavefront distortion in sample 3 with the high fictive temperature being considerably lower than in sample 1 with the lower fictive temperature. This demonstrates that the isotropic portion of the density change due to linearly polarized radiation depends on the fictive temperature of the respective quartz glass, and that this portion turns out to be lower in the sample having the high fictive temperature than in the sample having the low fictive temperature.

Optical components made from a quartz glass quality in accordance with samples 1 to 3 (with a hydroxyl group content around 250 wt ppm) are particularly suited for use in a projection system of an automatic exposure machine for immersion lithography for the purpose of transmitting ultraviolet, pulsed and linearly polarized UV laser radiation of a wavelength between 190 nm and 250 nm. Even better results can however be expected when the hydroxyl group content is below 200 wt ppm, preferably below 125 wt ppm as in sample 4.

First tests for checking the dependence of the anisotropic radiation damage on the pulse width of the transmitted laser light suggest that the quartz glass of the component of the invention has an improved resistance to pulses with a pulse width of 50 ns (in comparison with a pulse width of 25 ns). A further improvement of the radiation resistance was observed with respect to irradiation with pulse widths of 150 ns.

The invention claimed is:

1. A method for producing an optical component of quartz glass, said method comprising:

producing an SiO$_2$ soot body, vitrifying the soot body in a vacuum so as to form a cylindrical quartz glass blank with a hydroxyl group content in a range from 10 to 250 wt ppm, annealing the quartz glass blank so as to form a quartz glass cylinder having a fictive temperature above 1050° C., surrounding a contour of the optical component to be produced with an overdimension, removing part of the overdimension adjacent the axial ends of the quartz glass cylinder, loading the quartz glass cylinder with hydrogen by heating said quartz glass cylinder in a hydrogen-containing atmosphere at a temperature below 500° C. so as to generate in said quartz glass cylinder a mean hydrogen content in the range of $0.1 \times 10^{16}$ molecules/cm$^3$ to $5.0 \times 10^{16}$ molecules/cm$^3$.

2. The method according to claim 1, wherein said annealing comprises:

holding the quartz glass blank for a first holding period of at least 4 hours at a first higher annealing temperature which is at least 50° C. above the fictive temperature of the quartz glass component to be set, cooling the quartz glass blank at a first lower cooling rate to a second lower annealing temperature which is in a range of ±20° C. around a fictive temperature to be set for the quartz glass component, holding the quartz glass blank at the lower annealing temperature for a second holding period, and cooling the quartz glass blank to a predetermined final temperature below 800° C. at a second higher cooling rate which is at least 25° C./h.

3. The method according to claim 2, wherein the first cooling rate is set in a range of 1° C./h to 10° C./h.

4. The method according to claim 2, wherein the second cooling rate is in the range of 25° to 80° C./h.

5. The method according to claim 4 wherein the second cooling rate is above 40° C./h.

6. The method according to claim 2, wherein the second holding time is in a range of 1 hour to 16 hours.

7. The method according to claim 2, wherein the first holding time is not more than 50 hours.

8. The method according to claim 2, wherein the first cooling rate is set in a range of 3° to 5° C./h.

9. The method according to claim 1, wherein the quartz glass blank is loaded with hydrogen at a pressure in a range of 1 to 150 bar.

10. The method according to claim 1, wherein the quartz glass blank is loaded with hydrogen at a temperature below 400° C.

11. The method according to claim 1, wherein the hydroxyl group content of the cylindrical quartz glass blank is from 30 to 200 wt ppm.

12. The method according to claim 1, wherein the hydroxyl group content of the cylindrical quartz glass blank is 30 wt ppm or above and below 125 wt ppm.

13. The method according to claim 1, wherein the fictive temperature of the quartz glass cylinder is above 1100° C.

14. The method according to claim 1, wherein the predetermined final temperature to which the quartz glass blank is cooled is below 400° C.

15. The method according to claim 1, wherein the quartz glass blank is loaded with hydrogen at a temperature below 350° C.

* * * * *